SMALL PN-JUNCTION TUNNEL-DIODE SEMICONDUCTOR

Original Filed Dec. 9, 1960 2 Sheets-Sheet 1

Inventor:
Jerome J. Tiemann,
by John F. Ahern
His Attorney.

Feb. 22, 1966 J. J. TIEMANN 3,237,064

SMALL PN-JUNCTION TUNNEL-DIODE SEMICONDUCTOR

Original Filed Dec. 9, 1960 2 Sheets-Sheet 2

Inventor:
Jerome J. Tiemann,
by John F. Ahern
His Attorney.

United States Patent Office 3,237,064

Patented Feb. 22, 1966

3,237,064
SMALL PN-JUNCTION TUNNEL-DIODE SEMICONDUCTOR

Jerome J. Tiemann, Burnt Hills, N.Y., assignor to General Electric Company, a corporation of New York

Original application Dec. 9, 1960, Ser. No. 74,815, now Patent No. 3,197,839, dated Aug. 3, 1965. Divided and this application Oct. 10, 1963, Ser. No. 315,189
5 Claims. (Cl. 317—234)

Figure 1:
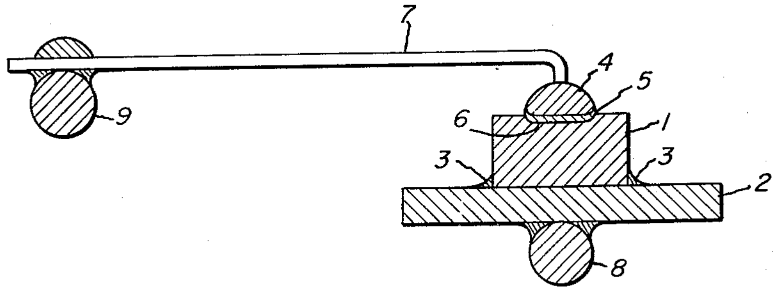

This application is a division of my copending application Serial Number 74,815, filed December 9, 1960, now Patent No. 3,197,839, which is in turn a continuation-in-part of my application Serial Number 858,995, filed December 11, 1959, now abandoned.

This invention relates to semiconductor devices and in particular to semiconductor diode devices of the type having a very narrow P-N junction space charge region such that at low voltages the current therethorugh is determined essentially by the quantum mechanical tunneling process. Devices of this type are referred to as "tunnel diode devices." Such devices are to be distinguished from other known P-N junction diodes wherein the diode current at low voltages is due essentially to injection of minority charge carriers. Such latter semiconductor diodes will be referred to hereinafter as "injection type diodes" as distinguished from "tunnel diodes."

The term "tunnel diode device" is intended to include semiconductor diode devices comprising a narrow P-N junction space charge region formed between two similar semiconductive materials as well as devices comprising such a junction space charge region formed between two dissimilar semiconductive materials, provided that the current at low voltages is determined essentially by the quantum mechanical tunneling process.

One example of a semiconductor diode device of the type to which this invention relates comprises a P-N junction region formed between degenerate P-type conductivity and degenerate N-type conductivity semiconductive material. Such a device has a narrow junction space charge region and exhibits a negative resistance region in the low forward voltage range of its current-voltage characteristic. Devices of this type have been described in the booklet entitled "Tunnel Diodes," published in November 1959 by Research Information Services, General Electric Company, Schenectady, New York.

The use of the term "degenerate" in a semiconductor device is intended to denominate a body or region of semiconductive material, which if N-type, has substantially all of the states near the bottom of the conduction band occupied by electrons even at very low temperatures as shown on the Fermi-level diagram for the semiconductive material. Similarly, if the semiconductive material is P-type the term "degenerate" refers to a body or region wherein substantially all of the states in an appreciable region near the top of the valence band are emptied of electrons. Stated in another way "degenerate N-type semiconductor" refers to a body or region of semiconductive material containing a sufficient concentration of excess donor impurities to raise the "Fermi-level" thereof to a value of energy higher than the minimum energy of the conduction band on a Fermi energy level diagram for the semiconductive material. Similarly, "degenerate P-type semiconductor" refers to a body or region containing a sufficient concentration of excess acceptor impurities to depress the "Fermi-level" thereof to an energy lower than the maximum energy of the valence band on the Fermi energy level diagram for the semiconductive material. The "Fermi-level" in such energy level diagrams is the level at which the probability of finding an electron in a particular state is equal to one half. Typical energy level diagrams for semiconductive materials may be found on pages 78, 87, 90, 142, 164 and 165 of the text entitled "Introduction to Semiconductors" by W. Crawford Dunlap, Jr., published in 1957 by John Wiley and Sons, Inc., New York.

The concentration of donor or acceptor impurity necessary to render a semiconductive material degenerate depends upon the semiconductive material but is ordinarily greater than $10^{18}$ atoms per cubic centimeter. In a practical semiconductor diode device of the type to which this invention relates fabricated from germanium, for example, the impurity concentration is in the range of about $1 \times 10^{19}$ to several times $10^{20}$ atoms per cubic centimeter.

As used throughout the specification and in the appended claims the terms "tunnel diode" and "narrow junction semiconductor diode" respectively, are intended to denominate a semiconductor diode device having a narrow junction space charge region such that the current at low voltages is determined essentially by the quantum mechanical tunneling process. Depending upon the relative concentration of activator impurities in the P-type and N-type conductivity semiconductive material such a device may or may not exhibit a negative resistance characteristic at low forward voltages. The term "narrow" as used with respect to a P-N junction refers to the width of the space charge region separating adjacent regions of opposite-conductivity type normal to the plane of the P-N junction.

Semiconductor devices of the type described above have low impedance and a high shunt capacitance. At high frequencies, this places extreme requirements on the external circuit. For example, the shunt capacitance is difficult to neutralize and the low impedance of the device aggravates the difficulties due to lead inductance. Such devices also vary considerably in their electrical properties. For example, the conductivity of different devices often varies widely. For many circuit applications this is most undesirable since, in many cases, devices having substantially the same characteristics are required.

It is an object of this invention, therefore, to provide tunnel diode devices which overcome one or more of the disadvantages of the type described.

It is another object of this invention to provide an accurate and inexpensive method of producing tunnel diode devices having low capacitance and low series resistance.

It is another object of this invention to provide a method of fabricating a tunnel diode device particularly suitable for use at high frequencies.

It is a further object of this invention to provide a method of reproducibly providing tunnel diodes having predetermined electrical characteristics.

Briefly stated, in accord with one aspect of this invention the method of fabricating a narrow junction semiconductor diode device having a restricted junction area, comprises providing a degenerate semiconductor body of one-conductivity type and securing it to a metallic base plate. A dot of impurity material capable of imparting to the semiconductor body opposite-type conductivity is alloyed to the body and forms a recrystallized region of degenerate semiconductor of opposite-conductivity type.

A relatively large electrode is connected to the alloyed impurity material and the unit so formed is then subjected to a controlled and monitored electrolytic etching treatment. A current distribution pattern is established in the etching bath such that the greatest amount of etching takes place in the region of the junction in the semiconductor body. The etching treatment is continued until the device exhibits a current-voltage characteristic having a predetermined peak current.

Figure 2:
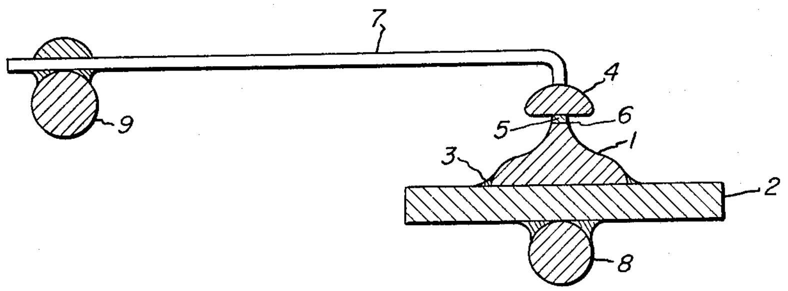
Figure 3:
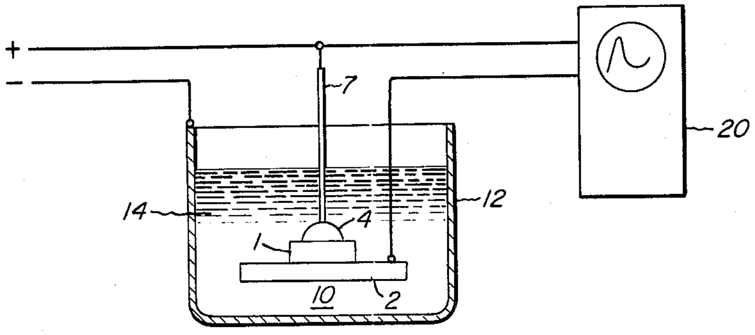
Figure 4:
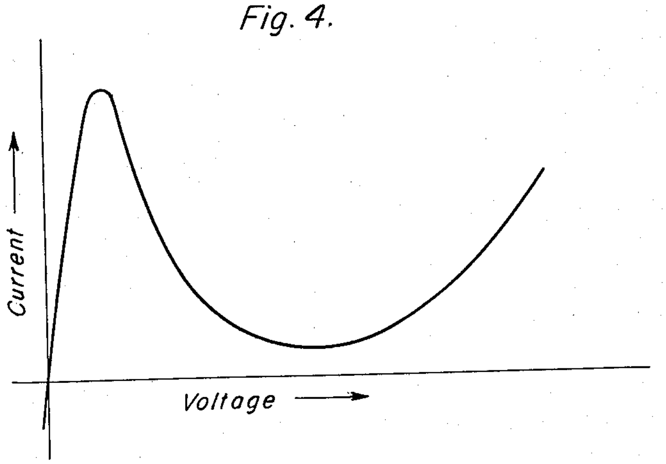
Figure 5:
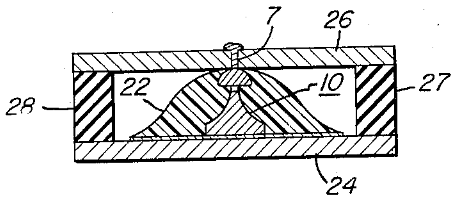

The novel features which I believe to be characteristic of my invention are set forth with particularity in the appended claims. My invention itself, however, together with further objects and advantages thereof will best be understood by reference to the following description, taken is conjunction with the accompanying drawings, in which:

FIGS. 1 and 2 are diagrammatic sectional views of a narrow junction semiconductor diode at different stages of fabrication by the method of this invention, FIG. 3 is an illustrative view showing a type of apparatus suitable for the preferential, controlled and monitored electrolytic etching treatment of this invention, FIG. 4 illustrates the current-voltage characteristic curve of a narrow junction degenerate semiconductor diode device, and FIG. 5 is a diagrammatic sectional view of a low inductance device constructed in accordance with the present invention.

Semiconductor junction diode devices of the "narrow junction" or "tunnel" type may exhibit a negative resistance at low forward voltages. The voltage range over which this negative resistance region may appear varies depending upon the semiconductive material from which the device has been fabricated. For example in a germanium device this range is from about 0.04 to 0.3 volt; for a silicon device the range is from about 0.08 to 0.4 volt, for a gallium antimonide device the range is from about 0.03 to 0.3 volt and for gallium arsenide the range is from about 0.12 to 0.5 volt.

The interpretation of the negative resistance phenomenon is based on the fact that carries can cross the junction by means of the quantum mechanical tunneling process. In order for this to be a likely process, however, the junction must be narrow, because the dependence of the barrier penetration factor on the barrier thickness is very strong. To provide tunnel diode devices of the highest quality, therefore, it is desirable that the junction be made very narrow. For example, in a high quality germanium tunnel diode the junction may be about 100 angstrom units wide. Such a narrow junction has a greater current carrying ability than a wider one; however, the capacitance thereof is also greater. Such high quality tunnel diode devices, therefore, are found to have low impedance and high shunt capacitance. This is an extremely undesirable combination especially for high frequency applications. In many cases, for example, requirements of the external circuit are severe because of the low impedance of the device. In addition, the frequency limit of a circuit utilizing such a device is lowered because of the high shunt capacitance. The problems associated with the inductance of the device, due to its electrodes, are further aggravated by its low impedance. It is extremely desirable, therefore, to reduce these adverse effects.

I have found that while the capacitance of a junction varies inversely with its width, its current carrying ability per unit area also varies inversely with its width but at a much faster rate. For this reason, a narrow junction is capable of carrying more current per unit of junction capacitance than a wider one.

In accord with this invention, therefore, adverse effects of the narrow junction are substantially eliminated by preferentially reducing the area of the junction by an inexpensive, accurately controlled and monitored electrolytic etching treatment while at the same time maintaining a large body area and large electrodes. Since the junction capacitance is substantially determined by the product of a constant times the area, reducing the junction area effectively reduces the capacitance. This invention provides a method, utilizing a controlled and monitored electrolytic etching treatment after the device has been mounted in a suitable package, which reduces the junction region at a faster rate than the remainder of the body until a device is obtained having particular predetermined electrical properties.

By this method a tunnel diode device is provided having a junction cross-sectional area which may be made very small relative to the cross-sectional area of its body. This results in a device having low series impedance, due to the relatively large bulk of the body, and low capacitance due to the extremely small junction area.

In accord with the present invention, a tunnel diode device of degenerate semiconductive material is fabricated in the following manner:

In the present description it will be assumed that N-type germanium is used for the semiconductor body of the device to be fabricated. It will be recognized, however, that the method set forth herein is equally applicable to any N or P-type semiconductor and may be applied to other semiconductors such as silicon, silicon carbide, Group III–V compounds and Group II–VI compounds, for example.

Initially, a body of germanium is provided which has been impregnated with a donor impurity, such as for example, by adding germanium phosphide to a melt in conventional manner to impart N-type conductivity thereto. The impurity concentration must be at least enough to render the semiconductor body degenerate, and can be as high as the limit of solubility of the impurity in the semiconductor body will allow. The impurity concentration preferred for germanium degenerate is in the range of about $1\times10^{19}$ atoms per cubic centimeter and may be as high as several times $10^{20}$ atoms per cubic centimeter.

In FIG. 1, semiconductor body 1 is connected to a metallic broad area base plate 2 which serves as a first electrode connection for the device. The plate is selected to have a coefficient of thermal expansion substantially equal to that of the body. Such materials are well-known in the art. A suitable base plate for germanium, for example, is a fernico containing by weight 54% iron, 29% nickel and 17% cobalt. Another suitable base plate having a coefficient of expansion approximately equal to that of germanium is a plate of gold-coated molybdenum. The body is soldered or otherwise connected to the base plate with a solder 3 containing an amount of a donor impurity such as antimony, to insure good nonrectifying contact.

A small quantity or dot of acceptor impurity material 4 such as indium mixed with gallium is placed on the opposite side of the body and heated to a temperature above the melting point of the impurity material. The temperature may be in the range of about 300° C. to 800° C. At this temperature the liquid acceptor impurity dissolves some of the germanium and forms a germanium-impurity solution which is progressively enriched with germanium by dissolution of the body until a solution is formed which has a melting point equal to the operating temperature. When the body is then cooled, recrystallization takes place and a single crystal layer 5 of germanium is formed on the base from which it was removed by the impurity material. This recrystallized germanium, however, is now heavily impregnated with acceptor impurity material and therefore has opposite or P-type conductivity. The two regions are separated by a narrow junction 6. Solid diffusion causes the impurities in the body to spread out over a distance which depends upon the time and temperature of heating. At temperatures in the range of about 400° C. to 700° C., for example, the time of heating may be from a few milliseconds to a few minutes.

Besides indium, a wide variety of other activator materials or mixtures of other materials may be used, providing their solubility in the semiconductor body is sufficient to make the semiconductor degenerate. Indium is particularly suitable because it is soft, and strains due to the alloying process have less effect on the germanium body than strains induced by some other materials. Further, solidification of the indium sets up a minimum of stress which might crack or damage the germanium body. In addition, indium acts as a low melting point solder for attaching a lead to the alloy.

The small quantity of impurity material may be placed on the body in solid, liquid or vapor form. The important feature in the formation of the junction is heating in contact with the impurity material. A second electrode 7 is connected to the alloyed impurity material dot 4. This may be, for example, by soldering or by pressing a wire into the impurity material where contact is desired. Alternatively, electrode 7 may be a broad area electrode suitably connected to dot 4.

The unit thus formed is then mounted in a holder by connecting electrode base plate 2 and electrode 7 to support members 8 and 9 respectively. The support members can be utilized further to provide connection of the device to an external circuit, if desired. For example, the holder may be a header, such as are well-known in the art for mounting transistors and the like. Any strains which have been set up in the electrode 7 due to the soldering or other connecting process are removed to minimize the tendency of the lead to become separated from the alloyed impurity material or cause any strain on the junction. This may be done by removing thermal stresses by annealing the electrode 7 or by mechanical means whereby compression is set up between the electrode 7 and the impurity material dot 4 tending to maintain the connection. This assures that there are no forces present which would tend to fracture the junction after it has been reduced to a small size. This mechanical means may be, for example, by lightly spreading the support members apart before connecting electrode 7 and, after this connection, removing the force. The support members are spread in such a direction that release of the spreading force results in a compression between the electrode and the connection to the alloyed impurity. This may be either in addition to, or in place of, annealing the electrode. The electrode may be conveniently annealed by a pulse of current sufficient to heat the electrode to incandescence. The unit is thus held in a manner free from strain, especially at the electrode-impurity material contact area.

This strain free mounting is required since, when a junction is reduced to a very small size, of the order of .001 inch diameter or less, for example, the junction is very fragile and the above mounting assures strain-free mechanical support before any reduction of its cross section takes place. When the junction area is reduced only a small amount as, for example, in providing matched units, and where the impedance level is not required to be high, the strain-free mounting may be dispensed with, if desired, since in such a case the junction may be relatively large and strong and small strains in the electrode connection are not so likely to cause damage thereto.

In further accord with my invention, I provide for reducing the area of the P–N junction and shaping the body of the device to achieve predetermined electrical characteristics by a controlled and monitored electrolytic etching treatment. It has been found that the side of a P–N junction maintained at the higher potential with respect to the electrolyte has the semiconductive material of its surface dissolved at a greater rate than the side of lower potential. In accord with this etching treatment, therefore, the recrystallized P-type region is maintained at a higher potential with respect to the electrolyte than the N-type region by connecting the positive side of the etching voltage to electrode 7 connected to alloy dot 4 and the negative side to the electrolyte. A suitable etching voltage, for example, may be in the range of about 1 to 5 volts. By making a suitable connection of electrodes 2 and 7 to a monitoring means as, for example, a current-voltage characteristic tracing oscilloscope, the current-voltage characteristic of the device may be observed while the etching proceeds. One typical current-voltage characteristic tracing oscilloscope for example, is a Techtronix model #575. Such a curve tracing oscilloscope includes the required circuitry to provide for exhibiting the current-voltage characteristic of the device thereon in well-known manner.

The electrolyte utilized in the etching treatment is selected to provide that the semiconductive material of body 1 is dissolved but not the material of dot 4 or base plate 2. Many electrolytes are known in the art which will provide such action in an electrolytic etching treatment, a suitable one being, for example, a dilute aqueous solution of potassium hydroxide. Although the concentration of electrolyte is not critical, it is preferable that the concentration be low enough to assure that current which shunts the P–N junction through the electrolyte is not sufficient to interfere with the monitoring of the current-voltage characteristic of the device. For an electrolyte of potassium hydroxide, for example, the range of concentration may conveniently be in the range of about .01 percent to 10 percent.

During an electrolytic etching treatment, the semiconductive material is dissolved from all surfaces of the body. For example, a cube of semiconductive material subjected to such a treatment would be etched substantially equally at all surfaces thereby resulting in a similar cube of smaller overall dimensions and ordinarily with any sharp corners rounded. Since alloy dot 4 and metal base plate 2 are not dissolved by the above etching treatment they serve to shield the surfaces thereunder. For example, where base plate 2 covers the entire base region of semiconductor body 1 no etching whatever takes place from this surface. Alloy dot 4 likewise shields approximately the entire P-type region so that no etching can take place from the surface of the P-type region so shielded.

As the etching treatment progresses, however, more and more of the P-type material under dot 4 is removed since this material is being substantially equally dissolved from those surfaces thereof which are not physically covered by dot 4. As etching further progresses the electrostatic shielding effect due to the equipotential of dot 4 reduces the rate of etching thereunder; such shielding being more and more significant as the portion of the P-type region remaining is more fully shielded by dot 4. Contact is always maintained, therefore, between alloy dot 4 and a portion of the P-type region thereunder until virtually all of this P-type region is dissolved away by etching action at the exposed surfaces. This results in a junction region of reduced cross section which joins alloy dot 4 and the bulk portion of semiconductor body 1. This is shown particularly in FIG. 2 of the drawing. As shown therein the junction region may be made very small, even microscopically so. The N-type region in the immediate vicinity of the junction is likewise small but, since this region is dissolved by the etching treatment at a slower rate than the recrystallized P-type region, it very rapidly increases in size with increasing distance from dot 4, thereby assuring a device having low series resistance. If the recrystallized region is of N-type conductivity the positive side of the etching voltage is similarly connected thereto to provide that the recrystallized region is at a higher potential with respect to the electrolyte than the other region thereby achieving the same preferential etching.

As described in detail hereinbefore, reducing the area of the junction lowers the peak current value of the device and also lowers the capacitance of the junction. The small area junctions made possible by the above controlled and monitored preferential etching treatment allows dependable and economical fabrication of devices having low capacitance and low series resistance. Because of the relationship between peak current and junction capacitance the etching treatment may be stopped whenever the monitor means indicates by a particular peak current that the device has the predetermined desired electrical characteristics. In addition, devices having uniform electrical characteristics may be likewise readily provided.

In accordance with this method, therefore, the mounted unit, generally designated at 10 in FIG. 3 is placed in an electrolytic etching apparatus generally designated at 12, with the positive side of the etching voltage source connected to electrode 7 contacting dot 4. The other side of the voltage source is connected to electrolyte 14. Electrolyte 14 may be an aqueous solution of potassium hydroxide or equivalent material which will electrolytically etch the semiconductive material of body 1 but not the material of dot 4 or base plate 2. As described in detail hereinbefore this arrangement produces current paths, due to the shielding effect of dot 4 and the potential gradient in the semiconductor body 1, which causes the P–N junction region to be reduced at a faster rate than the bulk of the body. When the semiconductor body 1 is originally relatively thin, which is usually the case in fabricating a practical device, the device, after suitable etching, has a generally conical configuration with the small diameter of the cone at the junction region and the large diameter at the base plate. Since the material of dot 4 and the electrode in contact therewith is not dissolved during the etching treatment, the area thereof is maintained large with respect to the now reduced junction.

Monitor means, such as current-voltage characteristic tracing oscilloscope 20, is connected to electrodes 2 and 7 to allow for the observation of the current-voltage characteristic of the device as etching progresses. Such monitoring allows for accurate reproduction of devices having matched electrical characteristics, and for accurately determining when desired electrical properties have been obtained. This may be accomplished, for example, by observing the current-voltage characteristic of the device during the etching treatment and controlling the etching current to obtain a characteristic having a particular peak current. As shown hereinbefore, there is a relationship between the peak current and the capacitance of the junction as well as between the peak current and the area of the junction. This observed peak current, therefore, gives an accurate indication of the electrical properties of the device. As used throughout the specification and in the appended claims the term "peak current" refers to the maximum current just before the negative resistance region of the current-voltage characteristic of the device. This is shown clearly in FIG. 4 which illustrates a typical current-voltage characteristic of a device of this type.

Observation of the characteristic curve on the oscilloscope, or other monitoring means, indicates the progress of the etching treatment by changes in the electrical characteristics of the device. For example, as the junction area is reduced the device will have a characteristic curve with a lower peak current. By controlling the etching current in accord with these observations, the rate of etching may be accurately regulated to provide extreme accuracy and reproducibility of devices having substantially the same impedance level and junction area. The etching is continued until a predetermined characteristic is observed or until a predetermined junction area has been obtained.

The peak current as observed on the monitored characteristic curve determines the impedance level of the device. When matched devices are desired, therefore, the etching is observed and continued until a current-voltage characteristic having a predetermined peak current has been reached, resulting in units having exactly the same impedance level. This can be accomplished with extreme accuracy, for example, by controlling and interrupting the etching current when a characteristic with this desired current value has been reached. It is desired to have an extremely small area junction to provide the lowest capacitance, which is desirable for high frequency applications, monitoring the device and controlling the etching current to regulate the etching rate provides for accurate production of devices having any desired small diameter junction without the danger of etching the junction completely away.

For higher frequency applications such as in the microwave and superhigh frequency ranges it is desired to eliminate substantially all external inductance from the device in addition to having the shunt capacitance of the device as small as possible. In such applications, for example, resonant cavities are utilized rather than lumped inductances and capacities.

In accord with another embodiment of this invention such a device is fabricated by a two-step process. First, the device is fabricated in accordance with the method outlined above with care being taken that all strains are removed from electrode 7 after mounting in the header and before the preferential electrolytic etching treatment. This is important since, for the higher frequency applications, the junction capacitance must be as low as possible and the junction must be etched to a very small diameter sometimes almost microscopically small which leaves it extremely fragile.

Referring now to FIG. 5, after the mounted unit 10 has had its junction reduced to the predetermined small size it is encased in a hardenable insulating material 22 to give complete mechanical support to the fragile junction. The material used, for example, may be a low melting glass or an epoxy resin. When the insulating material has hardened the encased device is removed from the header and mounted in a low inductance package.

In the low inductance package a first conducting plate 24 is connected to the metal base plate 2. A second conducting plate 26 is then connected to the opposite side of the device by clipping electrode 7 as short as possible and connecting it to plate 26 as shown. The two conducting plates are separated by insulating spacers 27 and 28 which may be of glass or any other insulating material suitable for high frequency purposes.

The two-step process allows the tunnel diode device to be subjected to the preferential etching treatment while mounted in a substantially strain-free header or other mounting package and the junction reduced to a very small size while at the same time having adequate mechanical support. While so supported, the preferentially etched device is encased in a hardenable insulating material to assure that the device will be mechanically strong. The encased device may then be removed from the header mounting and installed in the low inductance package without danger of damage to, or fracture of, the fragile junction. Such mounted narrow junction semiconductor diodes, for example, have been made to oscillate at frequencies in excess of 1500 mc.

In accord with a specific example of the method of this invention, a narrow junction semiconductor diode device is fabricated in the following manner:

A small body of germanium about 40 mils square and 10 mils in thickness impregnated with $4\times10^{19}$ phosphorous atoms per cubic centimeter to render it degenerate and of N-type conductivity is soldered to a fernico base plate as described hereinbefore, etched with CP4 etchant, rinsed and dried. The solder used is impregnated with a small quantity of antimony to assure a good non-rectifying contact. A dot of indium plus 2 atom percent gallium is placed on the surface of germanium opposite the base plate and alloyed in a furnace in a hydrogen atmosphere. The temperature of the furnace is raised to 575° C. This temperature is held for 10 seconds and then reduced slowly, about 1° per second, to 500° C. At 500° C. a 2 mil platinum wire is inserted into the liquid indium-gallium dot and the assembly cooled and removed from the furnace.

The fernico base plate and the platinum wire are then soldered to support wires in a header of the type well-known for mounting transistors. The unit is rinsed, etched slightly in CP4 etchant, re-rinsed and dried. A pulse of alternating current is passed through the diode to heat the platinum wire to incandescence to anneal it and remove any strains therefrom.

The mounted unit is then preferentially electrolytically etched in a 5 percent solution of potassium hydroxide with the positive side of the etching voltage connected to the indium-gallium dot 4. The etching voltage applied between electrode 7 and the electrolyte 14 is about 2 volts. The progress of the etching is monitored during the etch treatment by displaying the current-voltage characteristic curve of the device on a Techtronix model No. 575 characteristic curve tracing oscilloscope. The etching is discontinued when the peak current, as observed on the oscilloscope is 1 milliampere. The device so fabricated has a capacitance of 5 mmf., a series resistance of 1 ohm and a junction diameter of 0.4 mil. This represents a shunt capacitance about 1/240 that of the junction before etching.

For example, a typical prior art tunnel diode device has the following values at 25° C.:

| | |
|---|---|
| Peak current | 6 ma. |
| Valley current | 3 ma. |
| Junction diameter | $1.64\times10^{-2}$ cm. |
| Capacitance | 1200 mmf. |

A specific example of a tunnel diode device fabricated in accordance with my invention and before the etching treatment has the following values at 25° C.:

| | |
|---|---|
| Peak current | 250 ma. |
| Valley current | 50 ma. |
| Junction diameter | $1.64\times10^{-2}$ cm. |
| Capacitance | 1200 mmf. |

After the controlled and monitored preferential etching treatment of this invention the following values were found:

| | |
|---|---|
| Peak current | 1 ma. |
| Valley current | 0.2 ma. |
| Junction diameter | $1\times10^{-3}$ cm. |
| Capacitance | 5 mmf. |

Devices fabricated in accordance with this invention, therefore, exhibit characteristics of low capacitance and low series resistance. Also, since the electrode is connected before the etching treatment, a large electrode may easily be connected without danger of fracturing the body at the junction. This results in relatively low lead inductance since the lead may be provided many times larger in cross-sectional area than the junction itself. A desirable arrangement is one wherein the inductance of the lead is small with respect to the inductance of the junction or that of an external circuit component. A device so fabricated has a much higher frequency limit than would be calculated for a uniform narrow junction device and the series resistance due to the large body configuration is lower than would be expected from a cylindrical junction.

While only certain preferred features of the invention have been shown by way of illustration, many modifications will occur to those skilled in the art and it is, therefore, to be understood that the appended claims are intended to cover all such modifications as fall within the true spirit and scope of this invention.

What I claim as new and desire to secure by Letters Patent of the United States is:

1. A semiconductor device comprising: a body of semiconductive material having a small area P-N junction therein separating adjacent regions of opposite-conductivity type impregnated respectively with excess donor and acceptor impurity to a concentration greater than about $10^{18}$ atoms per cubic centimeter, said P-N junction being less than about 200 angstrom units so that the current at low voltages is determined essentially by the quantum mechanical tunneling process, said junction having a controlled preferentially etched cross-sectional area which is small as compared to the cross-sectional area of said body; and separate electrodes contacting said regions, each electrode having an area at least as large as the area of said P-N junction.

2. A semiconductor device comprising: a body of semiconductive material having an abrupt P-N junction therein separating adjacent regions of degenerate P-type and N-type conductivity, said body having a preferentially shaped generally conical configuration with the small diameter of said cone at the P-N junction region; and separate electrodes in nonrectifying contact with said P-type and said N-type conductivity regions, each of said electrodes having an area at least as great as the cross-sectional area of said P-N junction region.

3. A semiconductor device comprising: a semiconductor body having an abrupt P-N junction therein less than about 200 angstrom units wide separating adjacent regions of degenerate P-type and N-type conductivity, said body having a preferentially etched cross-section which is large with respect to the cross section of said P-N junction region; said device having a resistance substantially equal to that of a corresponding device of constant cross-section and having a capacity substantially less than that of said corresponding device and first and second electrodes contacting said P-type and N-type regions respectively, each of said electrodes having an area at least as great as the cross-sectional area of said P-N junction.

4. A tunnel diode device comprising: a semiconductor body having an abrupt P-N junction therein separating adjacent regions of degenerate P-type and N-type conductivity, said body having a preferentially etched cross section which is large with respect to the cross section of said P-N junction region; first and second electrodes contacting said P-type and said N-type regions respectively; a hardenable insulating material encasing said body and supporting said P-N junction; and a pair of large area conducting plates contacting said first and second electrodes respectively, said plates being separated by insulating spacers.

5. A tunnel diode device comprising: a body of semiconductive material whose bulk is degenerate and of one-type conductivity; a first broad area electrode in nonrectifying contact with one surface of said body; a dot of opposite-type conductivity imparting material fused to the surface of said body opposite said first electrode establishing a recrystallized region of opposite-type conductivity therein; a narrow P-N junction separating said regions and having a controlled preferentially etched cross section which is small as compared to the bulk of said body to provide said device with predetermined electrical characteristics; said device having a resistance substantially equal to that of a corresponding device of constant cross-section and having a capacity substantially less than that of said corresponding device and a second electrode in nonrectifying contact with said dot having a cross-sectional area at least as large as the cross-sectional area of said junction.

References Cited by the Examiner

UNITED STATES PATENTS

| | | | |
|---|---|---|---|
| 2,672,528 | 3/1954 | Shockley | 317—235 |
| 2,802,159 | 8/1957 | Stump | 317—235 |
| 2,946,935 | 7/1960 | Finn | 317—234 |
| 2,972,092 | 2/1961 | Nelson | 317—235 |
| 3,033,714 | 5/1962 | Ezaki | 317—235 |
| 3,081,418 | 3/1963 | Manintveld | 317—235 |
| 3,109,758 | 11/1963 | Batdorf | 317—237 |

JOHN W. HUCKERT, *Primary Examiner.*

JAMES D. KALLAM, *Examiner.*